(12) United States Patent
Guan

(10) Patent No.: US 10,871,325 B2
(45) Date of Patent: Dec. 22, 2020

(54) VACCUM DRYING APPARATUS

(71) Applicant: WUHAN CHINA STAR OPTOELECTRONICS SEMICONDUCTOR DISPLAY TECHNOLOGY CO., LTD., Hubei (CN)

(72) Inventor: Yuan Guan, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 78 days.

(21) Appl. No.: 16/338,708

(22) PCT Filed: Dec. 24, 2018

(86) PCT No.: PCT/CN2018/123127
§ 371 (c)(1),
(2) Date: Apr. 2, 2019

(87) PCT Pub. No.: WO2020/098077
PCT Pub. Date: May 22, 2020

(65) Prior Publication Data
US 2020/0158430 A1    May 21, 2020

(30) Foreign Application Priority Data
Nov. 15, 2018 (CN) .......................... 2018 1 1357047

(51) Int. Cl.
*F26B 13/30* (2006.01)
*F26B 5/04* (2006.01)
(Continued)

(52) U.S. Cl.
CPC ................ *F26B 5/04* (2013.01); *F26B 21/10* (2013.01); *G02F 1/1339* (2013.01); *H01L 21/67034* (2013.01)

(58) Field of Classification Search
CPC ................ G02F 1/1339; G02F 1/1303; H01L 21/67034; H01L 21/6719; F26B 5/04; F26B 21/10
(Continued)

(56) References Cited

U.S. PATENT DOCUMENTS 3,857,514 A * 12/1974 Clifton ...................... F24F 6/18
239/132
5,937,536 A * 8/1999 Kieselbach ............. F26B 5/044
34/202
(Continued)

FOREIGN PATENT DOCUMENTS

CN        106814545 A    6/2017
CN        107219727 A    9/2017

*Primary Examiner* — John P McCormack
(74) *Attorney, Agent, or Firm* — Mark M. Friedman

(57) ABSTRACT

An embodiment of the present invention discloses a vacuum drying apparatus, including a sealing chamber, a gas pressure adjusting device, and a support platform in the sealed chamber; wherein the air pressure adjusting device includes a main air pipe and a branch air pipe connected to the main air pipe, and the main air pipe is symmetrically disposed at a portion and a lower portion of the side surface of the sealed chamber. An embodiment of the present invention provides a vacuum drying apparatus employing the main air pipe up and down symmetrically disposed, which shortens the distance of air supply of the branch air pipe, reduces the pressure drop of the airflow, and stabilizes upper and lower air pressure, thereby stabilizing the product characteristics.

20 Claims, 2 Drawing Sheets

(51) Int. Cl.
     *G02F 1/1339*     (2006.01)
     *F26B 21/10*     (2006.01)
     *H01L 21/67*     (2006.01)

(58) Field of Classification Search
     USPC .................. 34/92; 239/434.5, 553, 553.5
     See application file for complete search history.

(56)             References Cited

U.S. PATENT DOCUMENTS

2004/0253375 A1* 12/2004 Ivanov .............. H01L 21/67051
                                                      427/240
2017/0322059 A1* 11/2017 Lowe ..................... G01F 1/46
2018/0230624 A1* 8/2018 Dube ................ H01J 37/32357

\* cited by examiner

VACCUM DRYING APPARATUS

BACKGROUND OF INVENTION

Field of Invention

The present invention relates to a field of semiconductor production apparatus, and in particular to a vacuum drying apparatus.

Description of Prior Art

In fabrication of a substrate of a thin film transistor-liquid crystal display (TFT-LCD), vacuum drying (VCD) is an important process. Vacuum drying involves drying and curing a substrate coated with coating liquid, such as a photoresist, under reduced pressure to cure the coating.

A complete lithography process completes the definition of a precision pattern on the substrate through the photoresist coating process, the exposure process, and the development process. In the vacuum drying process after a coating process, the substrate, coated with a photoresist, is placed in the sealed chamber, and the sealed chamber is vacuumed, so that the photoresist solvent reaches a saturated vapor pressure and rapidly volatilizes, and the volatilized gas is pumped away with airflow, thereby achieving preliminary drying of the photoresist.

An existing vacuum drying apparatus mainly uses air circulation to remove organic matter in the photoresist on the surface of the glass substrate. The photoresist itself has a certain fluidity in a liquid state. When a pressure supply of the vacuum drying apparatus is unstable, airflow through the surface of the substrate may cause a small range of flow of the photoresist, resulting in unevenness of a thickness of the photoresist on the surface of the glass substrate, thus negatively affecting product characteristics.

SUMMARY OF INVENTION

An embodiment of the present invention provides a vacuum drying apparatus, which shortens the distance of air supply of the branch air pipe, reduces the pressure drop of the airflow, and stabilizes upper and lower air pressure, thereby stabilizing the product characteristics.

In order to solve the above problems, an aspect of the present invention provides a vacuum drying apparatus for performing a vacuum drying treatment to a photoresist coated on a surface of a substrate, wherein the vacuum drying apparatus comprises a sealed chamber, a gas pressure adjusting device, and a support platform in the sealed chamber;

the support platform is configured to support the substrate coated with the photoresist, the air pressure adjusting device is disposed at a side of the sealed chamber, and the air pressure adjusting device comprises a main air pipe and a branch air pipe for introducing a protection gas to the sealed chamber, wherein the branch air pipe is connected to the main air pipe, and the main air pipe is symmetrically disposed at a portion and a lower portion of the side surface of the sealed chamber;

the main air pipe comprises an upper main air pipe and a lower main air pipe which are symmetrically disposed at the upper portion and the lower portion of the side surface of the sealed chamber, the sealed chamber has a capacity of accommodating 2n pieces of the substrates, wherein the upper main air pipe is configured to supply air to upper n pieces of the substrates in the sealed chamber, and the lower main air pipe is configured to supply air to lower n pieces of the substrates in the sealed chamber, wherein n is a positive integer; and the branch air pipe is a double-layered pipe.

Further, the branch air pipe comprises an outer pipe and an inner pipe, and a first cavity is formed within the inner pipe, and a second cavity is formed between the outer pipe and the inner pipe.

Further, the inner pipe is provided with a plurality of inner pipe outlets, and when intake air enters the branch air pipe through the main air pipe, the intake air fills the first cavity, and then fills the second cavity through the plurality of inner pipe outlets in the inner pipe.

Further, the outer pipe is provided with a plurality of outer pipe air outlets for introducing the protection gas into the sealed chamber, so that the photoresist on every portion of the surface of the substrate in the sealed chamber is dried evenly.

Further, the outer pipe and the inner pipe are both round pipes, and the outer pipe has a larger diameter than the inner pipe.

Further, an intake pipe is disposed on the branch air pipe, and the branch air pipe introduces the protection gas to the sealed chamber through the intake pipe, wherein a butterfly valve for adjusting a gas flow volume is disposed on the intake pipe.

In addition, the vacuum drying apparatus further comprising: a temperature adjustment module disposed on the support platform and comprising at least a heating sub-module and a cooling sub-module, wherein the temperature adjustment module is configured to regulate a local temperature on the substrate in the sealed chamber, so that the photoresist on every region of the surface of the substrate in the sealed chamber is dried evenly.

Further, the support platform is disposed at a substantially central position in the sealed chamber, such that a first gap is defined between opposite ends of the support platform and sidewalls of the sealed chamber, while a second gap is defined between the surface of the support platform and an upper cover and a lower cover of the sealed chamber, and an air passage is formed in the first gap between the opposite ends of the support platform and the sidewalls of the sealed chamber, as well as in the second gap between the surface of the support platform and the upper cover and the lower cover of the sealed chamber.

Another aspect of the present invention provides a vacuum drying apparatus for performing a vacuum drying treatment to a photoresist coated on a surface of a substrate, wherein the vacuum drying apparatus comprises a sealed chamber, a gas pressure adjusting device, and a support platform in the sealed chamber, wherein the support platform is configured to support the substrate coated with the photoresist, the air pressure adjusting device is disposed at a side of the sealed chamber, and the air pressure adjusting device comprises a main air pipe and a branch air pipe which supply a protection gas to the sealed chamber, wherein the branch air pipe is connected to the main air pipe, and the main air pipe is symmetrically disposed at a portion and a lower portion of the side surface of the sealed chamber.

Furthermore, the main air pipe comprises an upper main air pipe and a lower main air pipe which are symmetrically disposed at a portion and a lower portion of the side surface of the sealed chamber, the sealed chamber has a capacity of accommodating 2n pieces of the substrates, wherein the upper main air pipe is configured to supply air to upper n pieces of the substrates in the sealed chamber, and the lower main air pipe is configured to supply air to lower n pieces of the substrates in the sealed chamber, wherein n is a positive integer.

Furthermore, the branch air pipe is a double-layered pipe.

Furthermore, the branch air pipe comprises an outer pipe and an inner pipe, and a first cavity is formed within the inner pipe, and a second cavity is formed between the outer pipe and the inner pipe.

Furthermore, the inner pipe is provided with a plurality of inner pipe outlets, and when intake air enters the branch air pipe through the main air pipe, the intake air fills the first cavity and then fills the second cavity through the plurality of inner pipe outlets in the inner pipe.

Furthermore, the outer pipe is provided with a plurality of outer pipe air outlets for introducing a protection gas into the sealed chamber, so that the photoresist on every region of the surface of the substrate in the sealed chamber is dried evenly.

Furthermore, an intake pipe is disposed on the branch air pipe, and the branch air pipe introduces the protection gas to the sealed chamber through the intake pipe, wherein a butterfly valve is for adjusting a gas flow volume is disposed on the intake pipe.

In addition, the vacuum drying apparatus further comprising: a temperature adjustment module disposed on the support platform and comprising at least a heating sub-module and a cooling sub-module, wherein the temperature adjustment module is configured to regulate a local temperature on the substrate in the sealed chamber, so that the photoresist on every region of the surface of the substrate in the sealed chamber is dried evenly.

Furthermore, the temperature adjustment module is embedded in the support platform, and the heating sub-module of the temperature adjustment module is adjacent to an upper surface of the support platform, while the cooling sub-module is attached to a bottom of the heating sub-module.

Furthermore, the heating sub-module is an infrared thermal radiation source, and the cooling sub-module is a circulating water cooler.

The vacuum drying apparatus of the embodiment of the present invention comprises a sealing chamber, a gas pressure adjusting device, and a support platform in the sealed chamber; the support platform is configured to support the substrate coated with the photoresist, the air pressure adjusting device is disposed at a side of the sealed chamber, and the air pressure adjusting device comprises a main air pipe and a branch air pipe for introducing a protection gas to the sealed chamber, wherein the branch air pipe is connected to the main air pipe, and the main air pipe is symmetrically disposed at a portion and a lower portion of the side surface of the sealed chamber. An embodiment of the present invention provides a vacuum drying apparatus employing the main air pipe up and down symmetrically disposed, which shortens the distance of air supply of the branch air pipe, reduces the pressure drop of the airflow, and stabilizes upper and lower air pressure, thereby stabilizing the product characteristics.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
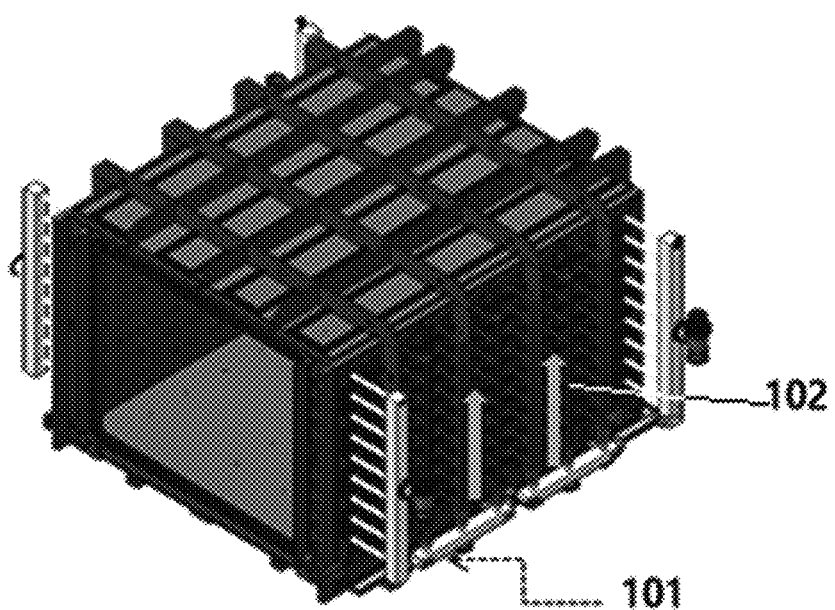
FIG. 1 is a schematic structural view of an existing design of a conventional vacuum drying apparatus.

Please refer to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

In an active array organic light-emitting diode or an active array organic light-emitting diode (AMOLED) process, vacuum drying is an important process for baking an organic photoresist. The purpose of the vacuum drying is to uniformly evaporate an organic solvent in the photoresist, so that a polymer material of the photoresist is polymerized better and more uniform. The vacuum drying apparatus for baking process mainly uses an air circulation to remove the organic matter in the photoresist on the surface of the glass substrate. The photoresist itself has a certain fluidity in a liquid state. When a pressure supply of the vacuum drying apparatus is unstable, airflow through the surface of the substrate may cause a small range of flow of the photoresist, resulting in unevenness of a thickness of the photoresist on the surface of the glass substrate, thus negatively affecting product characteristics.

FIG. 1 shows a schematic diagram of an existing structure of a conventional vacuum drying apparatus. A total air pipe 101 and a plurality of branch air pipes 102 are disposed on the side of the vacuum drying apparatus to provide a protection gas to the sealed chamber, and the sealed chamber can accommodate ten substrates. The total air pipe 101 is under the side of the apparatus and supplies air from the bottom to the top, resulting in a significant pressure drop at the bottom and upper parts of the device. After testing, the pressure at the bottom of the device is significantly higher than the upper air pressure, resulting an non-uniform air supply to the substrate at the bottom and upper parts of the device, so that thickness of the photoresist on the surface of each glass substrate in the device is uneven, which negatively affects product characteristics.

Figure 2:
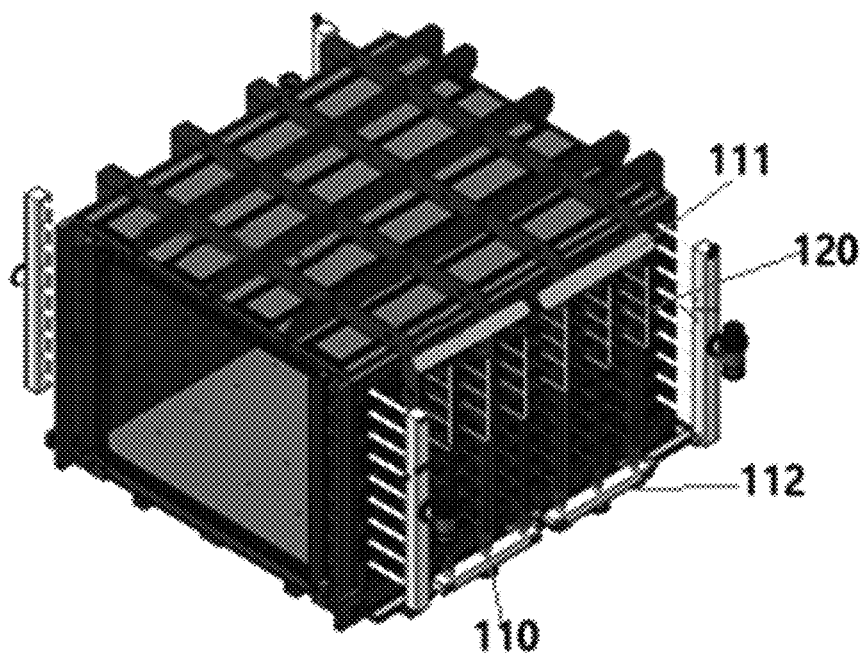
FIG. 2 is a schematic structural view of an exemplary vacuum drying apparatus according to an embodiment of the present invention.

In an embodiment of the present invention, a vacuum drying apparatus is provided for a vacuum drying treatment to a photoresist coated on a surface of a substrate. FIG. 2 shows a schematic structural view of an exemplary vacuum drying apparatus according to an embodiment of the present invention, wherein the vacuum drying apparatus includes a sealed chamber, a gas pressure adjusting device, and a support platform located in the sealed chamber.

The support platform is configured to support the substrate coated with the photoresist. The sealed chamber can be opened, and the substrate to be dried can be placed on the support platform, or the dried substrate can be taken out from the sealed chamber. The air pressure adjusting device is disposed at a side of the sealed chamber, and the air pressure adjusting device includes a main air pipe 110 and a branch air pipe 120 for introducing a protection gas to the sealed chamber, wherein the branch air pipe 120 is connected to the main air pipe 110, and the main air pipe 110 is symmetrically disposed at a portion and a lower portion of the side surface of the sealed chamber An embodiment of the present invention provides a vacuum drying apparatus employing the main air pipe up and down symmetrically disposed, which shortens the distance of air supply of the branch air pipe, reduces the pressure drop of the airflow, and stabilizes upper and lower air pressure, thereby stabilizing the product characteristics.

As shown in FIG. 2, in some embodiments of the present invention, the main air pipe 110 includes an upper main air pipe 111 and a lower main air pipe 112 which are symmetrically disposed at a portion and a lower portion of the side surface of the sealed chamber. The sealed chamber has a capacity of accommodating 2n pieces of the substrates, wherein the upper main air pipe 111 is configured to supply air to upper n pieces of the substrates in the sealed chamber, and the lower main air pipe 112 is configured to supply air to lower n pieces of the substrates in the sealed chamber, wherein n is a positive integer, and for example, when n is 5, and the sealed chamber accommodates 2*5=10 substrates.

Figure 3:
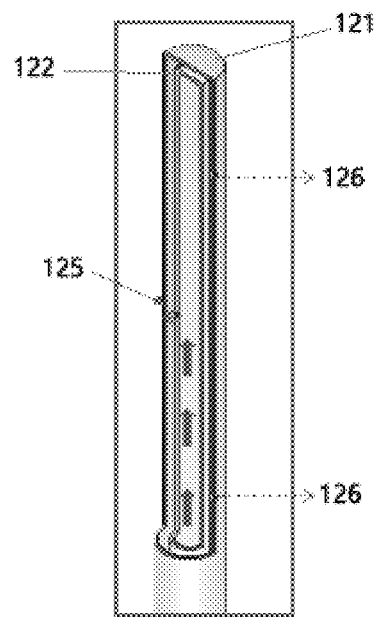
FIG. 3 is a schematic structural view of an exemplary branch air pipe in a vacuum drying apparatus according to an embodiment of the present invention.
Figure 4:
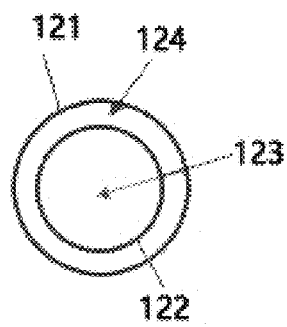
FIG. 4 is a schematic cross-sectional structural view of a branch air pipe in a vacuum drying apparatus according to an embodiment of the present invention.

In an embodiment of the present invention, when the main air tube is designed to be upper and lower symmetrical, the branch air pipe is also symmetrically designed upper and lower symmetrically based on a center line as a dividing line on the side of the sealed chamber. As such, a plurality of branch air pipes are arranged on the upper portion of the side of the sealed chamber (that may be as shown in FIG. 2, several branch air pipes are arranged side by side), while a plurality of branch air pipes are also arranged on the lower portion of the side of the sealed chamber Further, in the embodiment of the present invention, the branch air pipe adopts a double-layered design. As shown in FIG. 3, the branch air pipe includes an outer pipe 121 and an inner pipe 122. A first cavity 123 is formed within the inner pipe 122, and a second cavity 124 is formed between the outer pipe 121 and the inner pipe 122. As shown in FIG. 4, the outer pipe 121 and the inner pipe 122 may each have a circular cross section, that is, the outer pipe 121 and the inner pipe 122 are both round pipes, and the outer pipe 121 has a larger diameter than the inner pipe.

In some embodiments of the present invention, the inner pipe 122 is provided with a plurality of inner pipe outlets 125, and when intake air enters the branch air pipe 120 through the main air pipe 110, the intake air fills the first cavity 123, and then fills the second cavity 124 through the plurality of inner pipe outlets 125 in the inner pipe 122.

Similarly, the outer pipe 121 is also provided with a plurality of outer pipe air outlets 126 for introducing a protection gas into the sealing chamber, so that the photoresist in every portion of the surface of the sealed chamber is uniformly dried.

In some embodiments of the present invention, an intake pipe is disposed on the branch air pipe 120, and the branch air pipe 120 introduces the protection gas to the sealed chamber through the intake pipe, wherein a butterfly valve for adjusting a gas flow volume is disposed on the intake pipe, to make the intake airflow more stable and even.

In addition, the support platform is disposed at a substantially central position in the sealed chamber, such that a first gap is defined between opposite ends of the support platform and sidewalls of the sealed chamber, while a second gap is defined between the surface of the support platform and an upper cover and a lower cover of the sealed chamber, and an air passage is formed in the first gap between the opposite ends of the support platform and the sidewalls of the sealed chamber, as well as in the second gap between the surface of the support platform and the upper cover and the lower cover of the sealed chamber.

In other embodiments of the present invention, the vacuum drying apparatus further includes: a temperature adjustment module disposed on the support platform and comprising at least a heating sub-module and a cooling sub-module, wherein the temperature adjustment module is configured to regulate a local temperature on the substrate in the sealed chamber, so that the photoresist on every region of the surface of the substrate in the sealed chamber is dried evenly. Further, the temperature adjustment module is embedded in the support platform, and the heating sub-module of the temperature adjustment module is adjacent to an upper surface of the support platform, and the cooling sub-module is attached to the bottom of the heating sub-module.

Specifically, the support platform includes a casing, a cavity is formed in the casing, and the temperature adjustment module is disposed in the cavity. The temperature adjustment module includes a heating sub-module and a cooling sub-module, wherein the heating sub-module and the cooling sub-modules are stacked, and the heating sub-module is located above the cooling sub-module, adjacent to the upper surface of the support platform, to close to the substrate on a surface of the support platform for a better heating effect, while the cooling sub-module is attached to the bottom of the heating sub-module to quickly cool the corresponding heating sub-module.

At least one temperature adjustment module is disposed on the support platform. When the number of the temperature adjustment module is one, the temperature adjustment module is disposed in a central area of the support platform to regulate a temperature at the central area of the substrate. The temperature adjustment modules disposed in the central area of the support platform are concentrically circularly distributed, so that the adjacent temperature adjustment modules are closely connected to transfer heat to each other, which facilitates rapid heating and cooling of local areas.

When at least two temperature adjustment modules are disposed on the support platform, the temperature adjusting modules are dispersedly disposed on the support platform, in order to locally regulate the temperature of the substrate on the support platform, so that the photoresist at every portion on the surface of the substrate is dried evenly. Further, the heating sub-module is an infrared thermal radiation source, and the cooling sub-module is a circulating water cooler.

While the invention has been described in detail and with reference to specific embodiments thereof, it is to be understood that the foregoing description is exemplary and explanatory in nature and is intended to illustrate the invention and its preferred embodiments. Through routine experimentation, one skilled in the art will readily recognize that various changes and modifications can be made therein without departing from the spirit and scope of the invention.

What is claimed is:

1. A vacuum drying apparatus for performing a vacuum drying treatment to a photoresist coated on a surface of a substrate, wherein the vacuum drying apparatus comprises a sealed chamber, a gas pressure adjusting device, and a support platform in the sealed chamber, wherein the support platform is configured to support the substrate coated with the photoresist, the gas pressure adjusting device is disposed at a side of the sealed chamber, and the gas pressure adjusting device comprises a main air pipe and a branch air pipe for introducing a protection gas to the sealed chamber, wherein the branch air pipe is connected to the main air pipe, the branch air pipe extends in a direction perpendicular to a direction in which the main air pipe extends, and the main air pipe is symmetrically disposed at an upper portion and a lower portion of the side surface of the sealed chamber;

the main air pipe comprises an upper main air pipe and a lower main air pipe which are symmetrically disposed at the upper portion and the lower portion of the side surface of the sealed chamber, the sealed chamber has a capacity of accommodating 2n pieces of the substrates, wherein the upper main air pipe is configured to supply air to upper n pieces of the substrates in the sealed chamber, and the lower main air pipe is configured to supply air to lower n pieces of the substrates in the sealed chamber, wherein n is a positive integer; and the branch air pipe is a double-layered pipe.

2. The vacuum drying apparatus according to claim 1, wherein the branch air pipe comprises an outer pipe and an inner pipe, and a first cavity is formed within the inner pipe, and a second cavity is formed between the outer pipe and the inner pipe.

3. The vacuum drying apparatus according to claim 2, wherein the inner pipe is provided with a plurality of inner pipe outlets, and when intake air enters the branch air pipe through the main air pipe, the intake air fills the first cavity, and then fills the second cavity through the plurality of inner pipe outlets in the inner pipe.

4. The vacuum drying apparatus according to claim 2, wherein the outer pipe is provided with a plurality of outer pipe air outlets for introducing the protection gas into the sealed chamber, so that the photoresist on every portion of the surface of the substrate in the sealed chamber is dried evenly.

5. The vacuum drying apparatus according to claim 2, wherein the outer pipe and the inner pipe are both round pipes, and the outer pipe has a larger diameter than the inner pipe.

6. The vacuum drying apparatus according to claim 1, wherein an intake pipe is disposed on the branch air pipe, and the branch air pipe introduces the protection gas to the sealed chamber through the intake pipe, wherein a butterfly valve for adjusting a gas flow volume is disposed on the intake pipe.

7. The vacuum drying apparatus according to claim 1, further comprising:

a temperature adjustment module disposed on the support platform and comprising at least a heating sub-module and a cooling sub-module, wherein the temperature adjustment module is configured to regulate a local temperature on the substrate in the sealed chamber, so that the photoresist on every region of the surface of the substrate in the sealed chamber is dried evenly.

8. The vacuum drying apparatus according to claim 1, wherein the support platform is disposed at a substantially central position in the sealed chamber, such that a first gap is defined between opposite ends of the support platform and sidewalls of the sealed chamber, while a second gap is defined between the surface of the support platform and an upper cover and a lower cover of the sealed chamber, and an air passage is formed in the first gap between the opposite ends of the support platform and the sidewalls of the sealed chamber, as well as in the second gap between the surface of the support platform and the upper cover and the lower cover of the sealed chamber.

9. A vacuum drying apparatus for performing a vacuum drying treatment to a photoresist coated on a surface of a substrate, wherein the vacuum drying apparatus comprises a sealed chamber, a gas pressure adjusting device, and a support platform in the sealed chamber, wherein the support platform is configured to support the substrate coated with the photoresist, the gas pressure adjusting device is disposed at a side of the sealed chamber, and the gas pressure adjusting device comprises a main air pipe and a branch air pipe which supply a protection gas to the sealed chamber, wherein the branch air pipe is connected to the main air pipe, the branch air pipe extends in a direction perpendicular to a direction in which the main air pipe extends, and the main air pipe is symmetrically disposed at an upper portion and a lower portion of the side surface of the sealed chamber.

10. The vacuum drying apparatus according to claim 9, wherein the main air pipe comprises an upper main air pipe and a lower main air pipe which are symmetrically disposed at the upper portion and the lower portion of the side surface of the sealed chamber, the sealed chamber has a capacity of accommodating 2n pieces of the substrates, wherein the upper main air pipe is configured to supply air to upper n pieces of the substrates in the sealed chamber, and the lower main air pipe is configured to supply air to lower n pieces of the substrates in the sealed chamber, wherein n is a positive integer.

11. The vacuum drying apparatus according to claim 9, wherein the branch air pipe is a double-layered pipe.

12. The vacuum drying apparatus according to claim 11, wherein the branch air pipe comprises an outer pipe and an inner pipe, and a first cavity is formed within the inner pipe, and a second cavity is formed between the outer pipe and the inner pipe.

13. The vacuum drying apparatus according to claim 12, wherein the inner pipe is provided with a plurality of inner pipe outlets, and when intake air enters the branch air pipe through the main air pipe, the intake air fills the first cavity and then fills the second cavity through the plurality of inner pipe outlets in the inner pipe.

14. The vacuum drying apparatus according to claim 12, wherein the outer pipe is provided with a plurality of outer pipe air outlets for introducing a protection gas into the sealed chamber, so that the photoresist on every region of the surface of the substrate in the sealed chamber is dried evenly.

15. The vacuum drying apparatus according to claim 12, wherein the outer pipe and the inner pipe are both round tubes, and the outer pipe has a larger diameter than the inner pipe.

16. The vacuum drying apparatus according to claim 9, wherein an intake pipe is disposed on the branch air pipe, and the branch air pipe introduces the protection gas to the sealed chamber through the intake pipe, wherein a butterfly valve is for adjusting a gas flow volume is disposed on the intake pipe.

17. The vacuum drying apparatus according to claim 9, further comprising:

a temperature adjustment module disposed on the support platform and comprising at least a heating sub-module and a cooling sub-module, wherein the temperature adjustment module is configured to regulate a local temperature on the substrate in the sealed chamber, so that the photoresist on every region of the surface of the substrate in the sealed chamber is dried evenly.

18. The vacuum drying apparatus according to claim 17, wherein the temperature adjustment module is embedded in the support platform, and the heating sub-module of the temperature adjustment module is adjacent to an upper surface of the support platform, while the cooling sub-module is attached to a bottom of the heating sub-module.

19. The vacuum drying apparatus according to claim 17, wherein the heating sub-module is an infrared thermal radiation source, and the cooling sub-module is a circulating water cooler.

20. The vacuum drying apparatus according to claim 9, wherein the support platform is disposed at a substantially central position in the sealed chamber, such that a first gap is defined between opposite ends of the support platform and sidewalls of the sealed chamber, while a second gap is defined between the surface of the support platform and an upper cover and a lower cover of the sealed chamber, and an air passage is formed in the first gap between the opposite ends of the support platform and the sidewalls of the sealed chamber, as well as the second gap between the surface of the support platform and the upper cover and the lower cover of the sealed chamber.

\* \* \* \* \*